(12) United States Patent
Lee et al.

(10) Patent No.: US 12,300,917 B2
(45) Date of Patent: May 13, 2025

(54) PRINTED CIRCUIT BOARD CONNECTOR AND MODULE DEVICE COMPRISING SAME

(71) Applicant: LG INNOTEK CO., LTD., Seoul (KR)

(72) Inventors: Joo Young Lee, Seoul (KR); Sang Ah Lee, Seoul (KR); Yong Seok Cho, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 264 days.

(21) Appl. No.: 17/758,197

(22) PCT Filed: Dec. 31, 2020

(86) PCT No.: PCT/KR2020/019468
§ 371 (c)(1),
(2) Date: Jun. 29, 2022

(87) PCT Pub. No.: WO2021/137648
PCT Pub. Date: Jul. 8, 2021

(65) Prior Publication Data
US 2022/0384969 A1 Dec. 1, 2022

(30) Foreign Application Priority Data

Jan. 3, 2020 (KR) .......................... 10-2020-0000703
Mar. 20, 2020 (KR) .......................... 10-2020-0034548

(51) Int. Cl.
*H01R 12/52* (2011.01)
*H01R 4/02* (2006.01)
(Continued)

(52) U.S. Cl.
CPC ............ *H01R 12/52* (2013.01); *H05K 1/0203* (2013.01); *H01R 4/02* (2013.01); *H01R 4/308* (2013.01);
(Continued)

(58) Field of Classification Search
CPC .......... H01R 12/52; H01R 4/02; H01R 4/308; H05K 1/141; H05K 1/144; H05K 1/145;
(Continued)

(56) References Cited

U.S. PATENT DOCUMENTS 7,894,203 B2 * 2/2011 Kariya .............. H01L 23/49838
361/795
11,013,118 B2 * 5/2021 Watanabe ............ H05K 3/0052
(Continued)

FOREIGN PATENT DOCUMENTS

JP 7-111177 A 4/1995
JP 9-246686 A 9/1997
(Continued)

OTHER PUBLICATIONS

Supplementary European Search Report dated May 25, 2023 in European Application No. 20910334.0.
(Continued)

*Primary Examiner* — Hae Moon Hyeon
*Assistant Examiner* — Thang H Nguyen
(74) *Attorney, Agent, or Firm* — Saliwanchik, Lloyd & Eisenschenk

(57) ABSTRACT

Disclosed are a printed circuit board connector according to an embodiment and a module device including same. The printed circuit board connector comprises: a substrate; holes formed in the substrate at predetermined intervals and coated with a metal material on the inner circumferential surface thereof so as to form a metal layer; a first metal pad formed at one end of the holes and connected to the metal layer; and a second metal pad formed at the other end of the holes and connected to the metal layer.

11 Claims, 19 Drawing Sheets

(51) Int. Cl.
  *H05K 1/02* (2006.01)
  *H01R 4/30* (2006.01)
  *H05K 1/18* (2006.01)

(52) U.S. Cl.
  CPC ..... *H05K 1/18* (2013.01); *H05K 2201/10378* (2013.01)

(58) Field of Classification Search
  CPC .... H05K 1/18; H05K 1/181; H05K 2201/042; H05K 2201/066
  See application file for complete search history.

(56) References Cited

U.S. PATENT DOCUMENTS

| | | | | |
|---|---|---|---|---|
| 2006/0000639 A1* | 1/2006 | Lauffer | ................ | H05K 3/4641 |
| | | | | 174/262 |
| 2006/0121722 A1* | 6/2006 | Card | ................ | H05K 3/429 |
| | | | | 174/250 |
| 2007/0144772 A1* | 6/2007 | Lauffer | ................ | H05K 1/0256 |
| | | | | 174/260 |
| 2007/0289773 A1* | 12/2007 | Caletka | ................ | H05K 1/0219 |
| | | | | 174/262 |
| 2008/0098595 A1* | 5/2008 | Kresge | ................ | H05K 1/115 |
| | | | | 29/830 |
| 2008/0142258 A1* | 6/2008 | Caletka | ................ | H05K 1/0219 |
| | | | | 174/266 |
| 2009/0061656 A1 | 3/2009 | Tanaka et al. | | |
| 2012/0243147 A1* | 9/2012 | Marconi | ................ | B23K 1/20 |
| | | | | 361/679.01 |
| 2016/0197424 A1 | 7/2016 | L'Esperance et al. | | |
| 2020/0329562 A1* | 10/2020 | Hsieh | ................ | H05K 1/144 |
| 2020/0375034 A1* | 11/2020 | Watanabe | ............ | H05K 3/0052 |

FOREIGN PATENT DOCUMENTS

| | | |
|---|---|---|
| JP | 2003-273482 A | 9/2003 |
| JP | 2007-27304 A | 2/2007 |
| JP | 2008-131037 A | 6/2008 |
| JP | 4710627 B2 | 4/2011 |
| JP | 6623356 B1 | 12/2019 |
| KR | 10-2001-0082311 A | 8/2001 |
| KR | 10-2010-0135482 A | 12/2010 |
| KR | 20-2014-0004287 U | 7/2014 |
| KR | 10-1459480 B1 | 11/2014 |
| KR | 10-2019-0099728 A | 8/2019 |
| WO | 2010/038559 A1 | 4/2010 |

OTHER PUBLICATIONS

International Search Report dated Apr. 19, 2021 in International Application No. PCT/KR2020/019468.
Office Action dated Oct. 29, 2024 in Japanese Application No. 2022-539689.
Office Action dated Dec. 27, 2024 in Korean Application No. 10-2020-0034548.
Office Action dated Feb. 12, 2025 in Japanese Application No. 2022-539689.

* cited by examiner

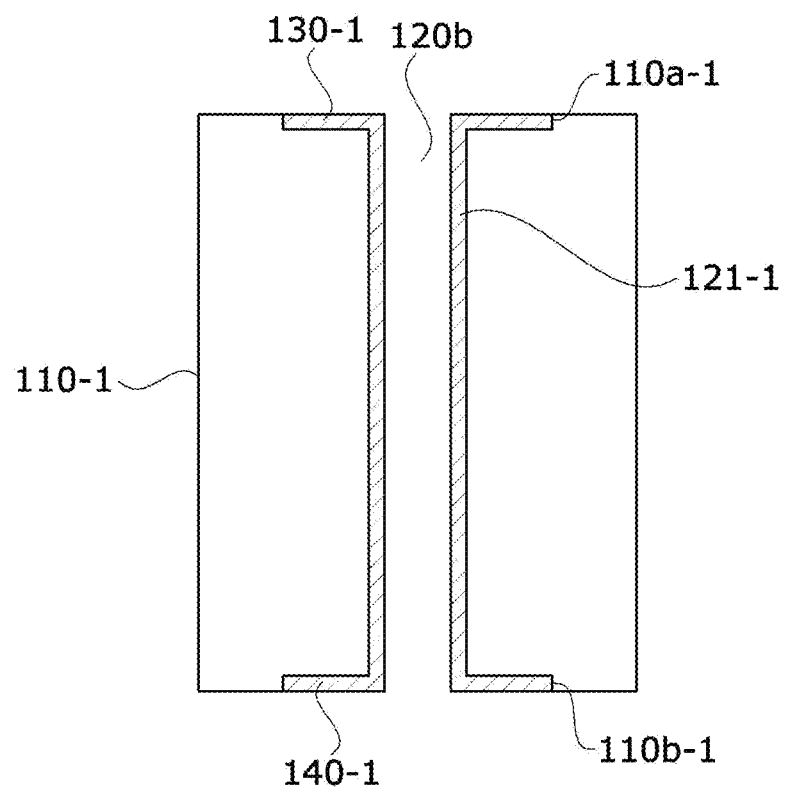

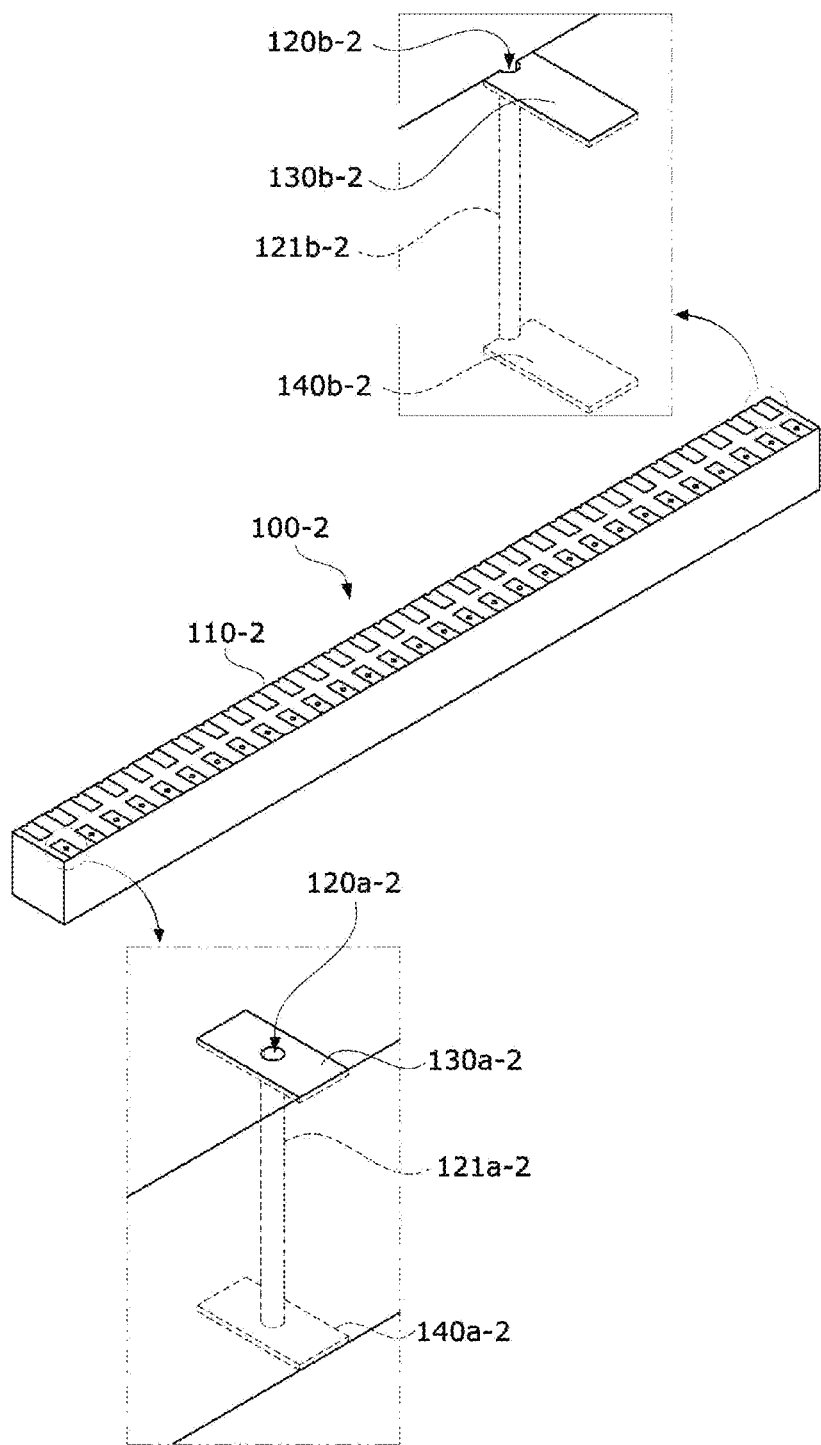

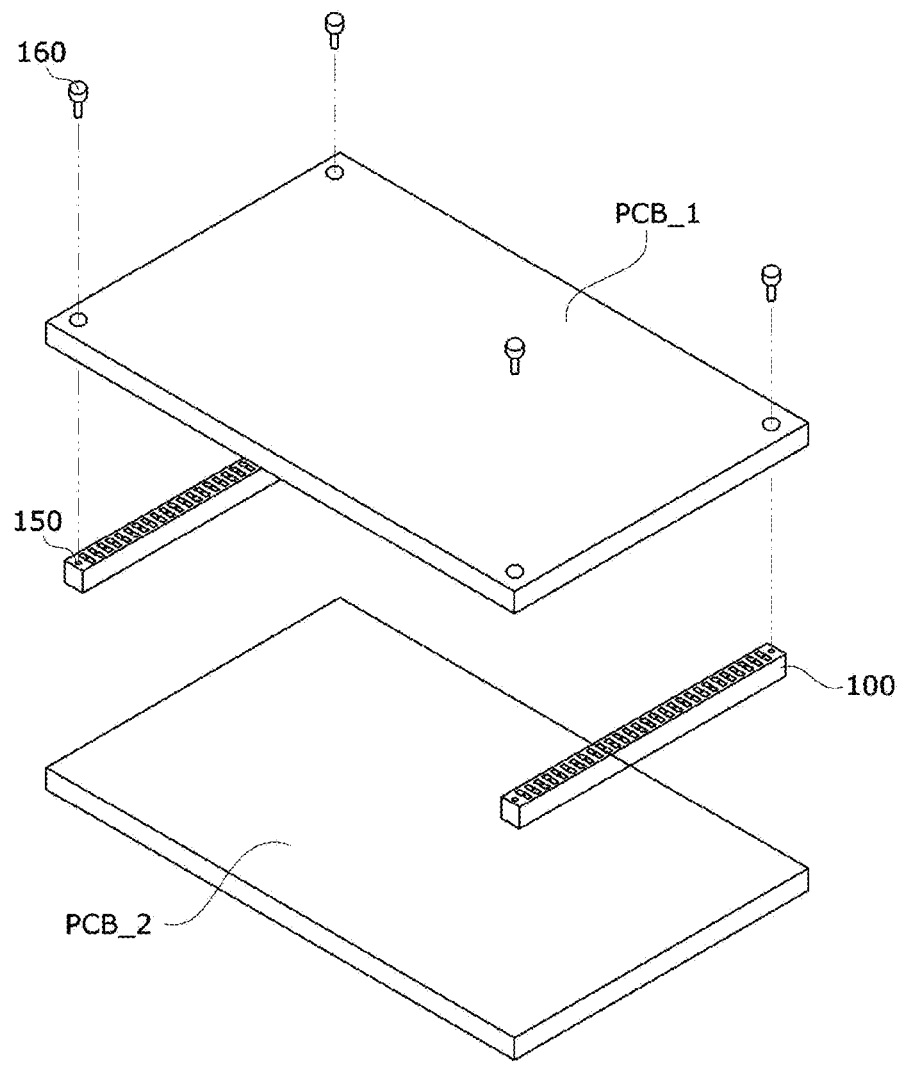

PRINTED CIRCUIT BOARD CONNECTOR AND MODULE DEVICE COMPRISING SAME

CROSS-REFERENCE TO RELATED APPLICATIONS

This application is the U.S. national stage application of International Patent Application No. PCT/KR2020/019468, filed Dec. 31, 2020, which claims the benefit under 35 U.S.C. § 119 of Korean Application Nos. 10-2020-0000703, filed Jan. 3, 2020; and 10-2020-0034548, filed Mar. 20, 2020; the disclosures of each of which are incorporated herein by reference in their entirety.

TECHNICAL FIELD

Embodiments of the present invention relate to a printed circuit board connector having a simple structure and a module device including the same.

BACKGROUND ART

As connectors used in electronic devices such as mobile phones and digital cameras that are being reduced in size and weight, connectors that connect electronic circuits disposed between two printed circuit boards (PCBs) facing each other are used.

FIGS. 1A and 1B are views for describing problems of the conventional interface method.

Referring to FIG. 1A, a connector 10 couples a slot provided in one PCB 20 to be connected and a pin provided in another PCB 30 to be connected, and thus signal lines formed on two PCBs are connected due to the coupling of the slot and the pin.

As connectors that need to transmit signals for complex functions to communication products, connectors using a pin-to-slot method, a harness (flexible PCB) method, or the like have been used. However, in such methods, there are problems in that a separate connector artwork space is insufficient and height is limited as the number of pins increases, additional problems in that pin alignment is difficult and warpage and the like occur in the assembly process, problems on contact resistance and a contact short circuit, and problems in that it is impossible to implement the number of pins (200 pins or more) enough to transmit signals for complex functions. In addition, there are problems in that such methods can be used only for communication products designed exclusively for radio frequency (RF) and high-speed communication and increase cost as the number of pins increases and the pins are being reduced in size.

Referring to FIG. 1B, due to the above problems, a land grid array (LGA) method is recently used. However, in the LGA method, one surface of a PCB should also be used as an SMT pad, and thus an artwork space is insufficient and there are issues of flatness and soldering.

Therefore, a new interface method in which the problems of the conventional interface method can be solved is required.

DOCUMENT OF RELATED ART (Patent Document 1) Korean Laid-open Patent Publication No. 10-2010-0135482

(Patent Document 2) Japanese Patent Publication No. 4710627

DISCLOSURE

Technical Problem

Embodiments of the present invention are directed to providing a printed circuit board connector having a simple structure and a module device including the same.

Technical Solution

One aspect of the present invention provides a printed circuit board connector including a substrate; holes formed in the substrate at predetermined intervals and having an inner circumferential surface coated with a metal material to form a metal layer; a first metal pad formed at one end of the hole and connected to the metal layer; and a second metal pad formed at the other end of the hole and connected to the metal layer.

The substrate may include a first surface and a second surface facing the first surface, the first metal pad may be formed on the first surface, the second metal pad may be formed on the second surface, and the first metal pad and the second metal pad may have a one-to-one correspondence.

The metal layer, the first metal pad, and the second metal pad may be integrally formed.

The first metal pad may be bonded to a signal line of a first printed circuit board disposed on the first surface of the substrate by welding.

The second metal pad may be bonded to a signal line of a second printed circuit board disposed on the second surface of the substrate by soldering.

The holes may be formed to be positioned side by side on an edge of at least one side of the substrate.

The printed circuit board connector may further include coupling grooves formed at end portions of the first surface of the substrate to be coupled to coupling members.

The first metal pad may be brought into contact with the signal line of the first printed circuit board disposed on the first surface of the substrate by using a solder ball.

The solder ball may be a metal having hardness of 250 Mpa based on Brinell hardness.

Another aspect of the present invention provides a printed circuit board connector including a substrate; grooves formed in the substrate at predetermined intervals and having an inner circumferential surface coated with a metal material to form a metal layer; a first metal pad formed at one end of the groove and connected to the metal layer; and a second metal pad formed at the other end of the groove and connected to the metal layer.

The substrate may include a first surface and a second surface facing the first surface, the first metal pad may be formed on the first surface, the second metal pad may be formed on the second surface, and the first metal pad and the second metal pad may have a one-to-one correspondence.

The metal layer, the first metal pad, and the second metal pad may be integrally formed.

The first metal pad may be bonded to a signal line of a first printed circuit board disposed on the first surface of the substrate by welding.

The second metal pad may be bonded to a signal line of a second printed circuit board disposed on the second surface of the substrate by soldering.

The grooves may be formed to be positioned side by side on an edge of at least one side of the substrate.

Still another aspect of the present invention provides a module device including a printed circuit board including a first surface on which elements are mounted and a second surface facing the first surface; printed circuit board connectors coupled to edges of the printed circuit board; a heat dissipation plate disposed on the second surface; and a fence disposed on the first surface and positioned between the printed circuit board connectors.

Advantageous Effects

According to the embodiments, a printed circuit board connector having a simple structure, in which a metal layer is formed by forming holes side by side in at least one row in a substrate and coating an inner circumferential surface of the hole with a metal material, a first metal pad connected to the metal layer is formed on one end of the hole, and a second metal pad connected to the metal layer is formed on the other end of the hole, can be provided.

According to the embodiments, it is possible to reduce manufacturing costs of a printed circuit board connector due to a simple structure, and it is possible to manufacture the printed circuit board connector with various sizes through an easy manufacturing method.

According to the embodiments, it is possible to inhibit defects such as contact short circuits that can occur during soldering, solder cracks that can occur during re-melting, and the like.

According to the embodiments, double-sided mounting, which is impossible in the LGA method, can be possible, and the flatness problem that can occur in the LGA method when soldering with a printed circuit board can be solved.

According to the embodiments, when at least one surface of a substrate is brought into contact with a signal line of a printed circuit board by using a solder ball, the at least one surface of the substrate can be stably fixed by being coupled to the signal line of the printed circuit board using a coupling member.

DESCRIPTION OF DRAWINGS

FIGS. 6A and 6B are views illustrating shapes of a metal layer and a metal pad according to the second embodiment of the present invention.

FIG. 7 is a view illustrating shapes of a metal layer and a metal pad according to a third embodiment of the present invention.

FIGS. 9A and 9B are views for describing another connection form of the printed circuit board connectors.

MODES OF THE INVENTION

Figure 1A:
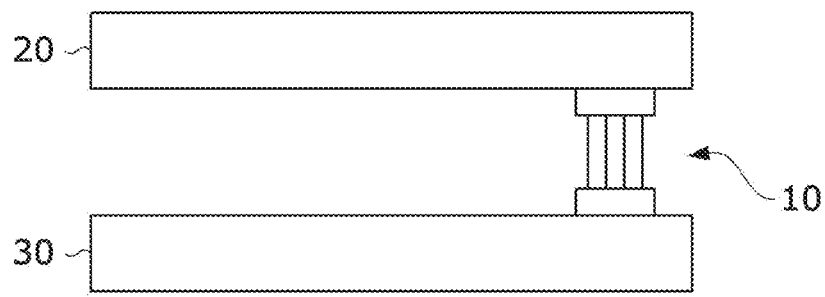
FIGS. 1A and 1B are views for describing problems of a conventional interface method.
Figure 1B:
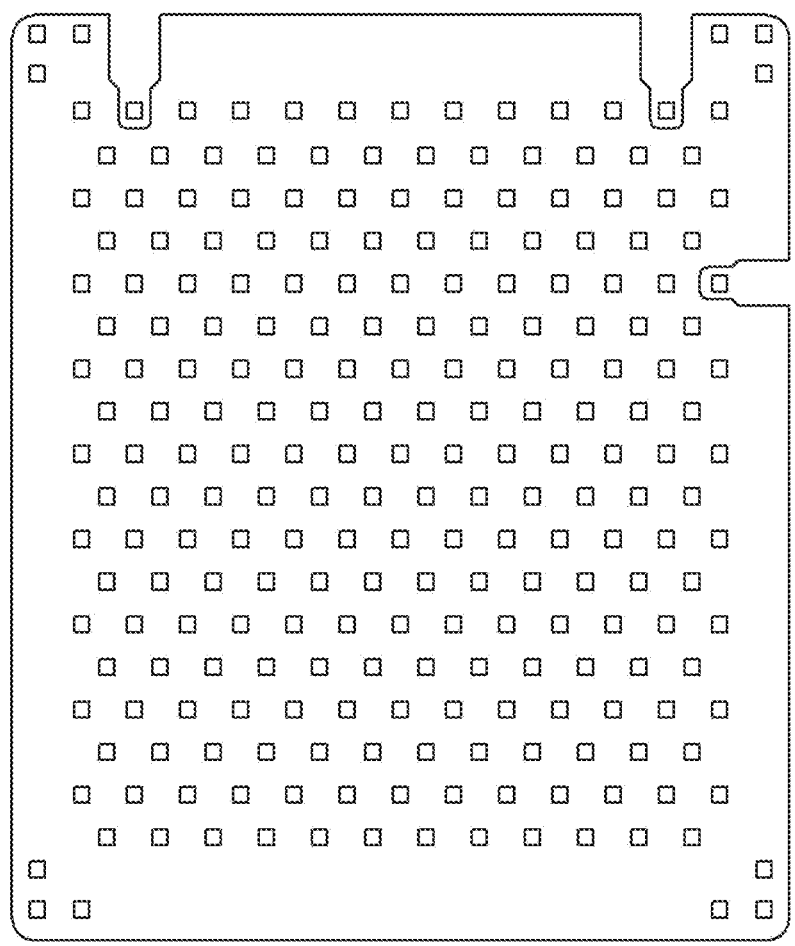

Hereinafter, exemplary embodiments of the present invention will be described in detail with reference to the accompanying drawings.

However, it should be understood that the technical spirit of the present invention is not limited to the embodiments to be disclosed below but may be implemented in many different forms. It should be understood that, within the scope of the present invention, one or more elements of each of the embodiments may be selectively combined and substituted.

In addition, the terms (including technical and scientific terms) used in the embodiments of the present invention have the same meaning as commonly understood by one of ordinary skill in the art to which the present invention belongs. It should be further understood that terms, such as those defined in commonly used dictionaries, should be interpreted as having a meaning that is consistent with their meaning in the context of the related art.

Further, the terms used in the embodiments of the present invention are provided only to describe the embodiments of the present invention and not for purposes of limitation.

In this specification, the singular forms include the plural forms unless the context clearly indicates otherwise, and the phrase "at least one element (or one or more elements) of an element A, an element B, and an element C," should be understood as including the meaning of one or more of all combinations being obtained by combining the element A, the element B, and the element C.

Further, in describing elements of the present invention, terminologies such as first, second, A, B, (a), and (b) may be used.

The term is used to distinguish an element from another element but a nature, an order, or a sequence of the elements is not limited by the terminology.

It will be understood that when an element is referred to as being "connected" or "coupled" to another element, it can be directly connected or coupled to another element, intervening elements may be present, or it can be connected or coupled to another element through still another element.

Further, when an element is described as being formed "on (above)" or "under (below)" another element, the term "on (above)" or "under (below)" includes both of a case in which two elements are in direct contact with each other or a case in which one or more elements are (indirectly) disposed between two elements. In addition, the term "on (above)" or "under (below)" includes a case in which another element is disposed in an upward direction or a downward direction with respect to one element.

In the embodiments, a new structure, in which a metal layer is formed by forming holes side by side in at least one row in a substrate and coating an inner circumferential surface of the hole with a metal material, a first metal pad connected to the metal layer is formed on one end of the hole, and a second metal pad connected to the metal layer is formed on the other end of the hole, is proposed.

A connector having such a new structure is referred to as a surface-mount technology (SMT) type patterned connector (SPC). The SPC may be implemented by an etching, pattern through-hole (PTH), or electroplating method.

Figure 2A:
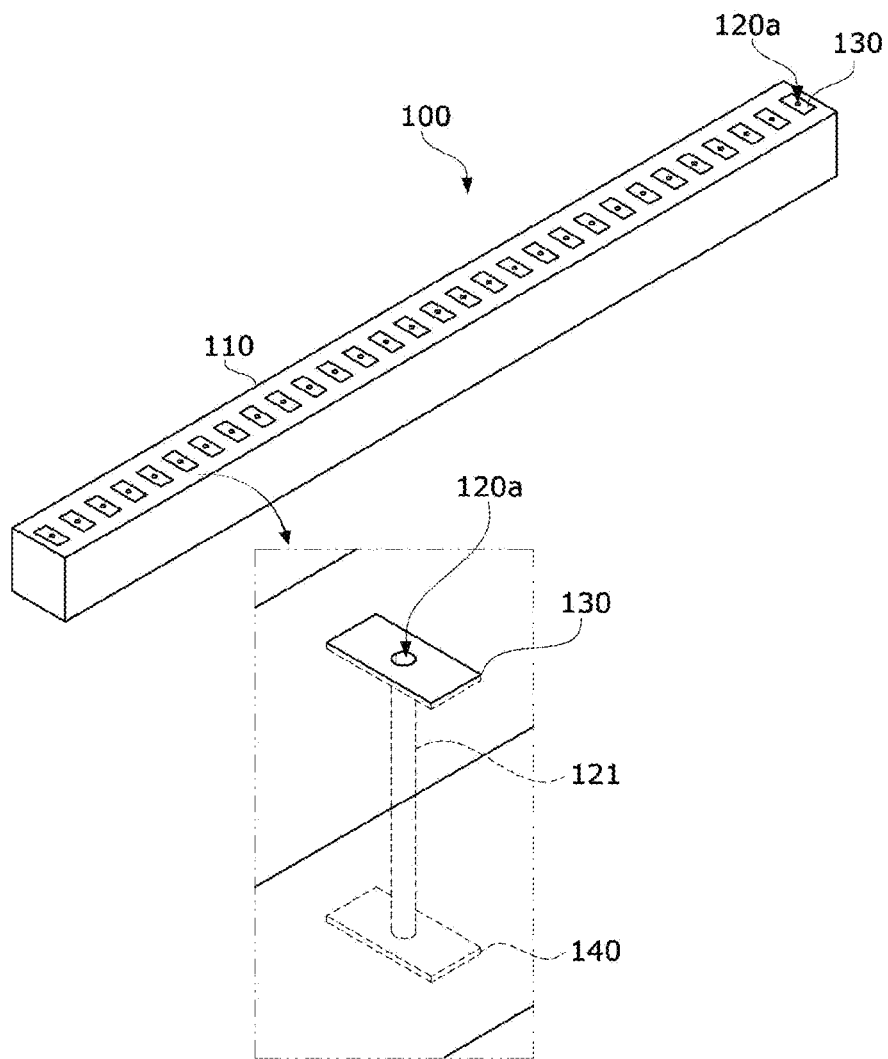
FIGS. 2A and 2B are views illustrating a printed circuit board connector according to a first embodiment of the present invention.
Figure 2B:
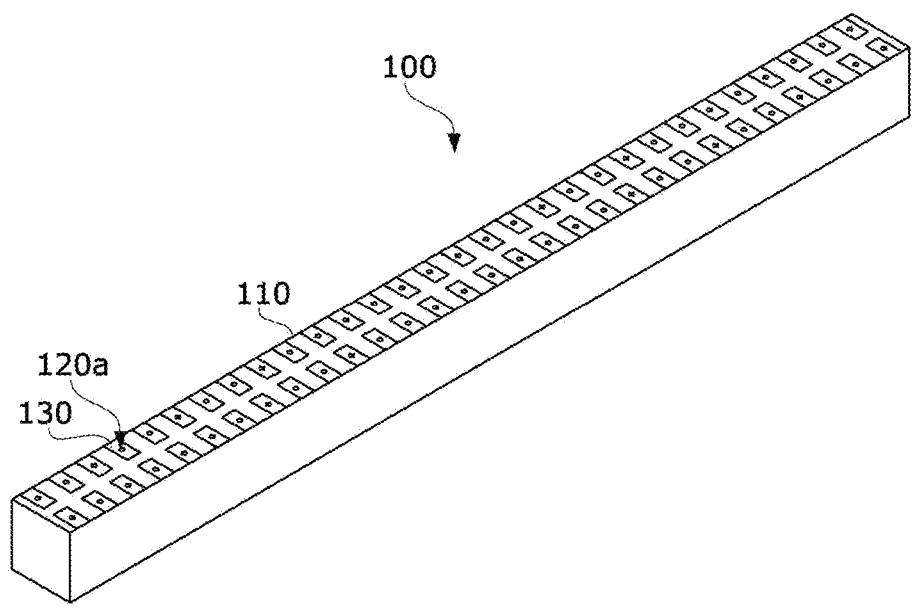

FIGS. 2A and 2B are views illustrating a printed circuit board connector according to a first embodiment of the present invention.

Referring to FIGS. 2A and 2B, a printed circuit board connector 100 according to the first embodiment of the present invention may include a substrate 110, holes 120a, first metal pads 130, and second metal pads 140.

The substrate 110 may be formed of an insulating material, and the insulating material may include, for example, an epoxy or the like, and may be an insulating material of 106 MΩ or more.

The substrate 110 may be formed to have a bar shape. The substrate 110 may be formed smaller than a printed circuit board to be electrically connected thereto and may be disposed on an edge portion of the printed circuit board.

The holes 120a may be formed in the substrate 110 at regular intervals. The holes 120a may be formed in one row as illustrated in FIG. 2A, or the holes 120a may be formed in two rows as illustrated in FIG. 2B. In this case, a diameter of the hole may range from 0.3 to 0.5 mm.

When the holes 120a are formed in one row as illustrated in FIG. 2A, the holes 120 120a may be formed in a central portion of the substrate 110, but the present invention is not limited thereto, and the holes 120a may be formed in edge portions of the substrate 110. Further, the holes 120a may be formed in one row, two rows, or three or more rows.

When the holes 120a are formed in two rows as illustrated in FIG. 2B, the case in which the holes 120a in the two rows are formed in parallel is described, but the present invention is not limited thereto, and the holes 120a may be formed to have a zigzag shape.

A metal layer coated with a metal material may be formed on an inner circumferential surface of the hole 120a. Here, the metal material may be a conductive material and may include, for example, copper (Cu), silver (Ag), or the like.

The first metal pad 130 may be formed at one end of the hole 120a and connected to a metal layer 121, and the second metal pad 140 may be formed at the other end of the hole 120a and connected to the metal layer 121. In this case, the first metal pad 130 and the second metal pad 140 may be formed of a conductive material.

The first metal pad 130 and the second metal pad 140 may be formed in one-to-one correspondence.

Here, an example of the case in which the first metal pad 130 and the second metal pad 140 have the same size and shape is described, but the present invention is not limited thereto, and the sizes or shapes of the first metal pad 130 and the second metal pad 140 may be different as necessary.

Further, an example of the case in which the first metal pad 130 and the second metal pad 140 are formed to have a quadrangular shape is described, but the present invention is not limited thereto, and the first metal pad 130 and the second metal pad 140 may be formed to have one of various shapes.

Figure 3A:
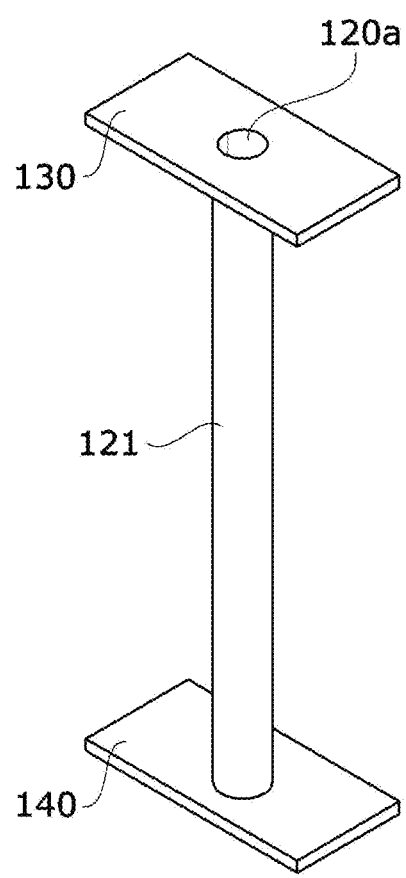
FIGS. 3A and 3B are views illustrating shapes of a metal layer and a metal pad according to the first embodiment of the present invention.
Figure 3B:
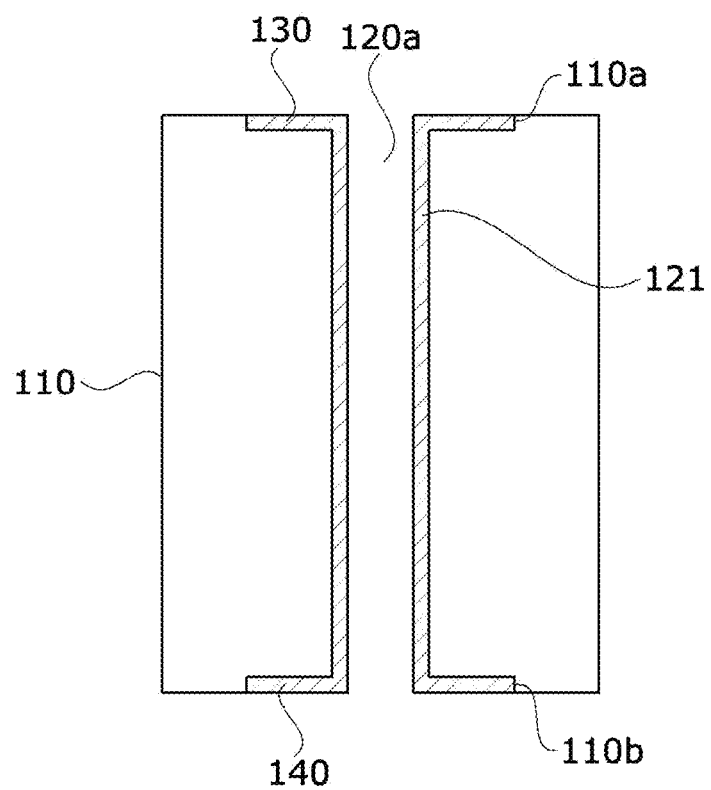

FIGS. 3A and 3B are views illustrating shapes of the metal layer and the metal pad according to the first embodiment of the present invention.

Referring to FIG. 3A, the first metal pad 130 and the second metal pad 140 according to the embodiment of the present invention may be connected to the metal layer 121 formed on the inner circumferential surface of the hole 120a. Here, an example of the case in which a cross section of the hole 120a has a circular shape is described, but the present invention is not limited thereto, and the cross section of the hole 120a may have one of various shapes and may include, for example, an elliptical shape or a polygonal shape.

The first metal pad 130, the second metal pad 140, and the metal layer 121 may be integrally formed.

Referring to FIG. 3B, the first metal pad 130 according to the embodiment may be formed on a first surface of the substrate 110 and may be formed in a groove 110a formed in the first surface of the substrate 110. Therefore, one surface of the first metal pad 130 may be coplanar with the first surface of the substrate 110.

Likewise, the second metal pad 140 according to the embodiment may be formed on a second surface of the substrate 110 and may be formed in a groove 110b formed in the second surface of the substrate 110. Therefore, one surface of the second metal pad 140 may be coplanar with the first surface of the substrate 110.

Figure 4A:
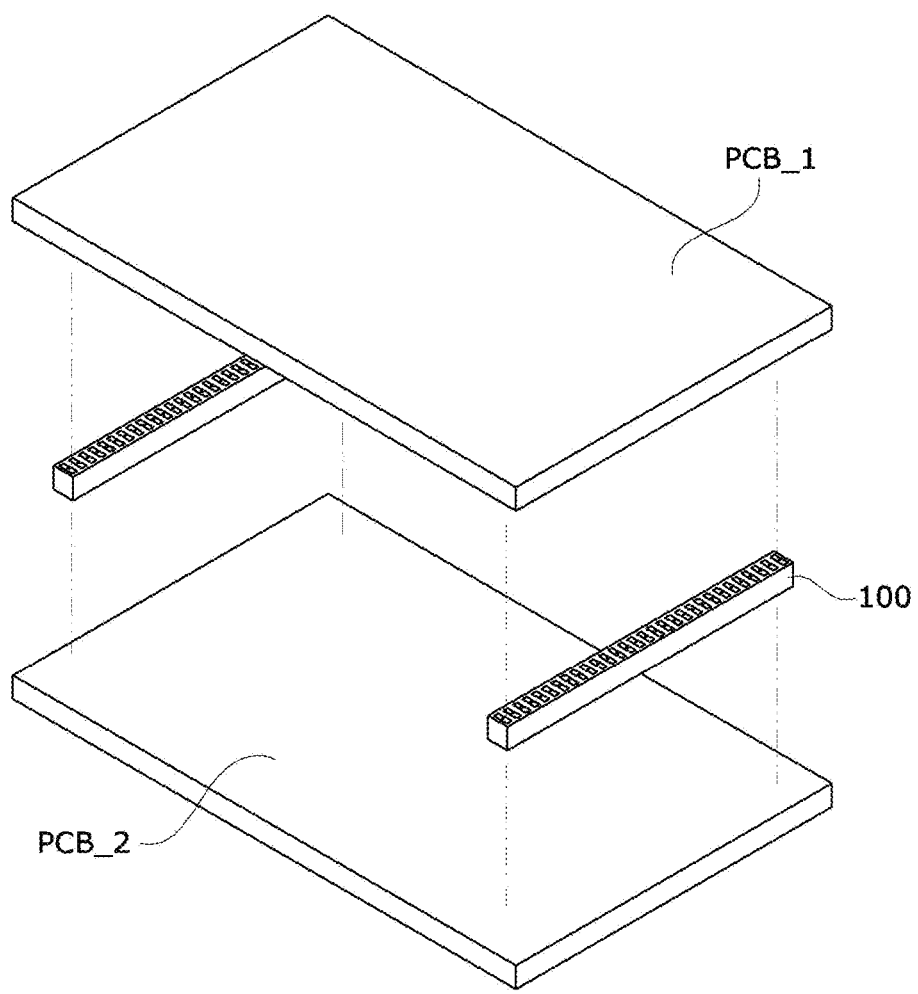
FIGS. 4A and 4B are views for describing a connection form of the printed circuit board connectors according to the embodiment.
Figure 4B:
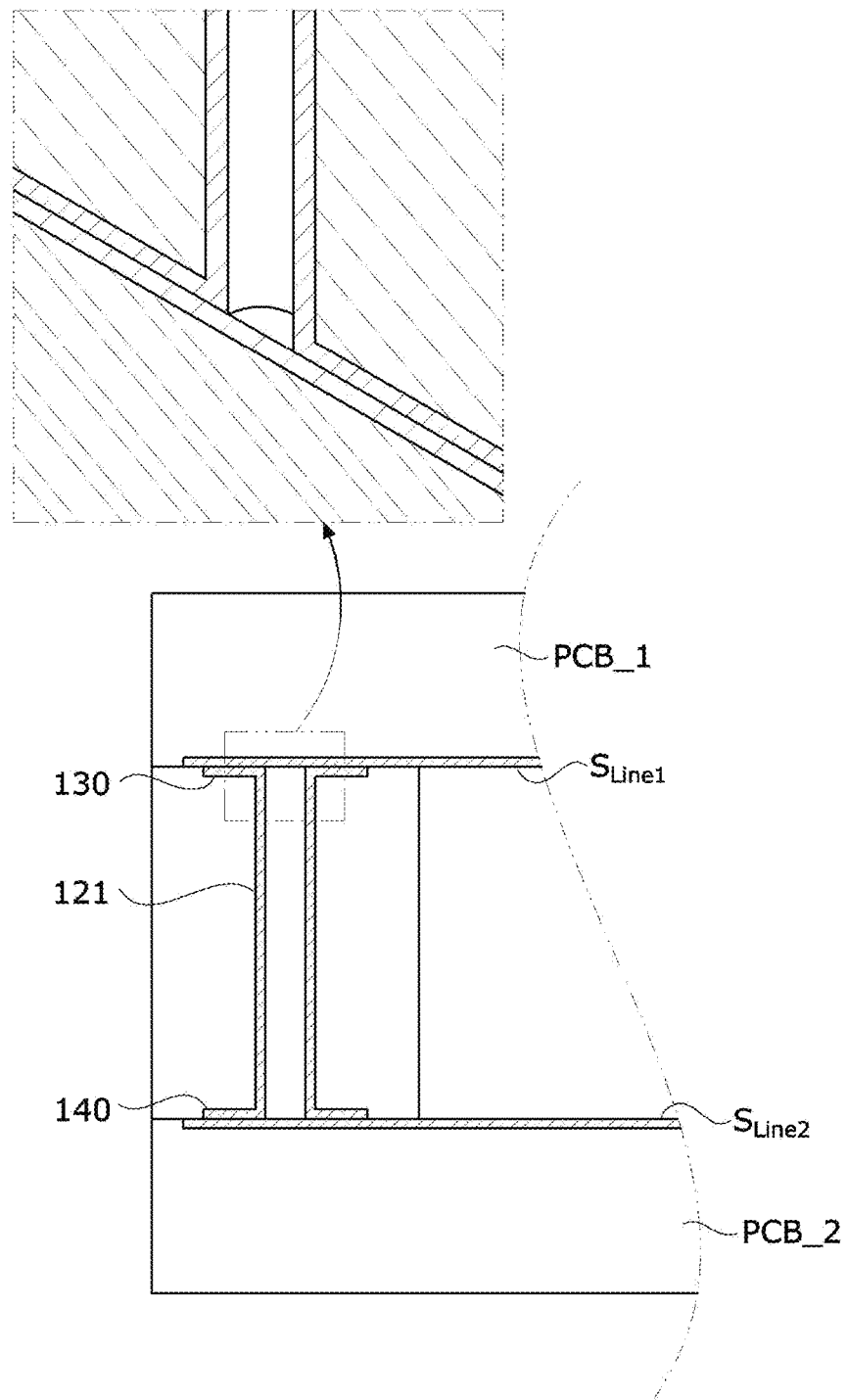

FIGS. 4A and 4B are views for describing a connection form of printed circuit board connectors according to an embodiment.

Referring to FIGS. 4A and 4B, in printed circuit board connectors 100 according to the embodiment of the present invention, first metal pads 130 may be formed on a first surface of the substrate 110, and second metal pads 140 may be formed on a second surface facing the first surface.

The first metal pad 130 may be connected to a signal line $S_{Line1}$ of a first printed circuit board PCB_1, and the second metal pad 140 may be connected to a signal line SLine2 of a second printed circuit board PCB_2.

The first metal pad 130 may be bonded to the signal line $S_{Line1}$ of the first printed circuit board PCB_1 and may be bonded, for example, by spot welding using a laser.

In this case, the laser may radiate onto the first metal pad 130 through a hole so that the first metal pad 130 may be bonded by welding.

The second metal pad 140 may be bonded to the signal line SLine2 of the second printed circuit board PCB_2 and may be bonded, for example, by soldering using a solder ball.

Here, an example of the case in which the first metal pad 130 is bonded to the signal line of the first printed circuit board by welding and the second metal pad 140 is bonded to the signal line of the second printed circuit board by soldering is described, but the present invention is not limited thereto, and the first metal pad 130 may also be bonded to the signal line of the first printed circuit board by soldering.

Figure 5A:
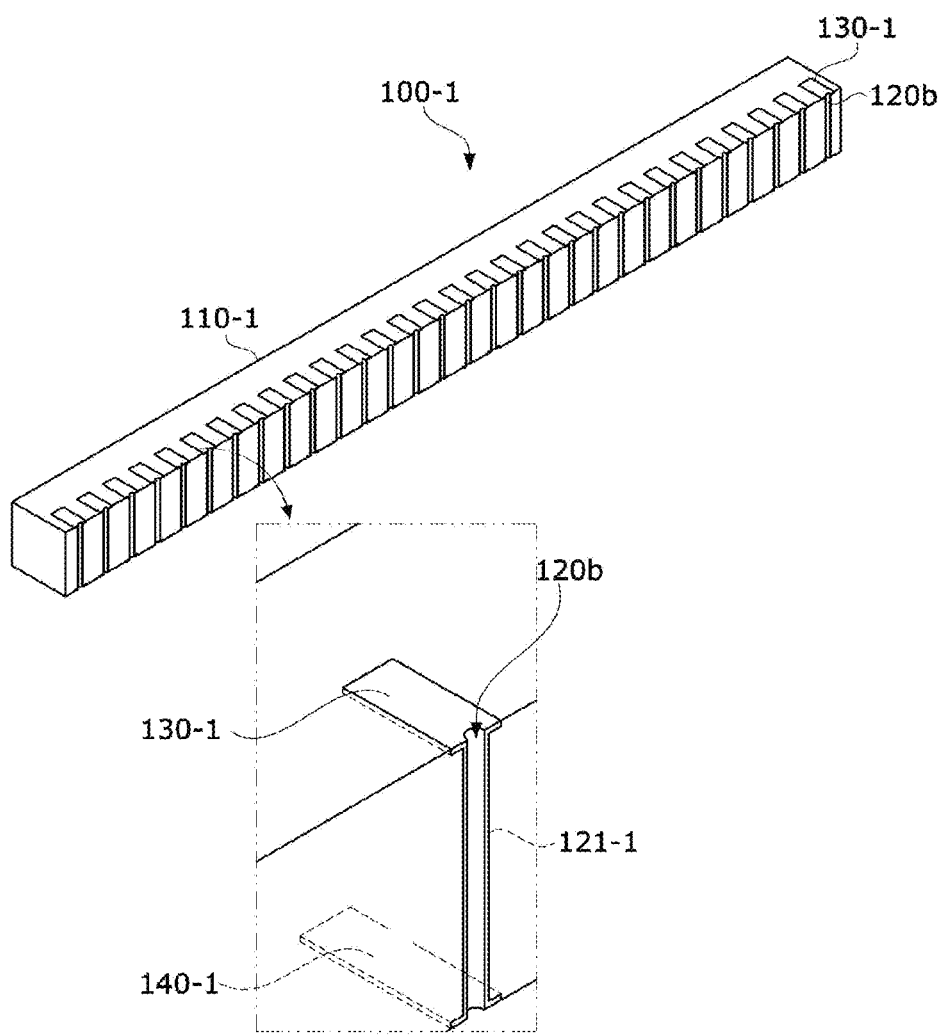
FIGS. 5A and 5B are views illustrating a printed circuit board connector according to a second embodiment of the present invention.
Figure 5B:
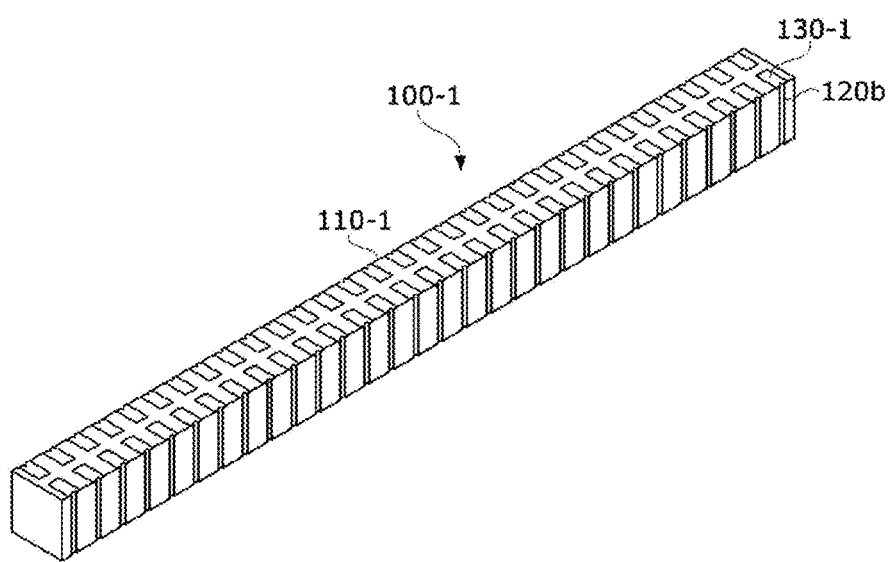

FIGS. 5A and 5B are views illustrating a printed circuit board connector according to a second embodiment of the present invention.

Referring to FIGS. 5A and 5B, the printed circuit board connector 100-1 according to the second embodiment of the present invention may include a substrate 110-1, grooves or side vias 120b, first metal pads 130-1, and second metal pads 140-1.

The substrate 110-1 may be formed of an insulating material.

The grooves 120b may be formed in the substrate 110-1 at regular intervals. The grooves 120b may be formed in one row as illustrated in FIG. 5A or the grooves 120b may be formed in two rows as illustrated in FIG. 5B.

When the grooves 120b are formed in one row as illustrated in FIG. 5A, the grooves 120b may be formed in a central portion of the substrate 110-1, but the present invention is not limited thereto, the grooves 120b may be formed in edge portions of the substrate 110-1. Further, the grooves 120b may be formed in one row, two rows, or three or more rows.

When the grooves 120b are formed in two rows as illustrated in FIG. 5B, the case in which the grooves 120b in the two rows are formed in parallel is described, the present invention is not limited thereto, and the grooves 120b may be formed to have a zigzag shape.

A metal layer coated with a metal material may be formed on an inner circumferential surface of the groove 120b.

Figure 6A:
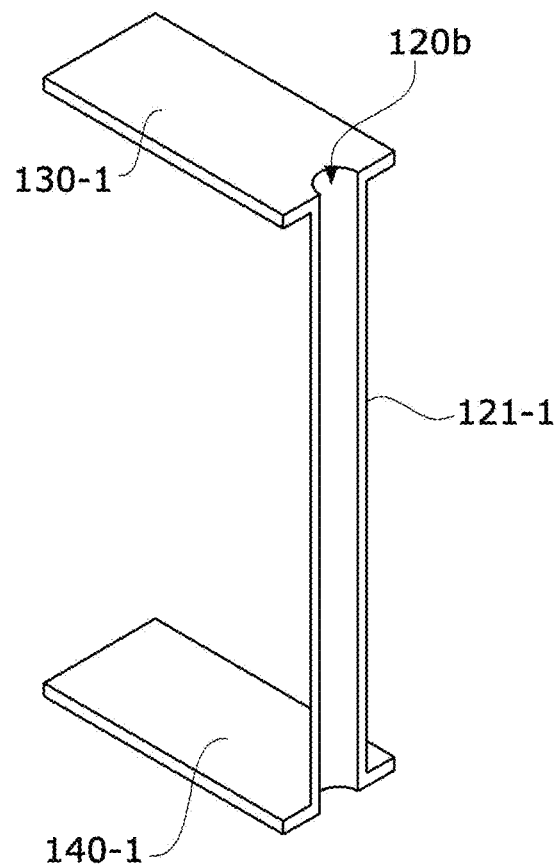

FIGS. 6A and 6B are views illustrating shapes of the metal layer and the metal pad according to the second embodiment of the present invention.

Referring to FIG. 6A, the first metal pad 130-1 and the second metal pad 140-1 according to the embodiment of the present invention may be connected to a metal layer 121-1 formed on the inner circumferential surface of the groove 120b.

The first metal pad 130-1, the second metal pad 140-1, and the metal layer 121-1 may be integrally formed.

Referring to FIG. 6B, the first metal pad 130-1 according to the embodiment may be formed on a first surface of the substrate 110-1 and may be formed in a groove 110a-1 formed in the first surface of the substrate 110-1. Therefore, one surface of the first metal pad 130-1 may be coplanar with the first surface of the substrate 110-1.

Likewise, the second metal pad 140-1 according to the embodiment may be formed on a second surface of the substrate 110-1 and may be formed in a groove 110b-1 formed in the second surface of the substrate 110-1. Therefore, one surface of the second metal pad 140-1 may be coplanar with the first surface of the substrate 110-1.

FIG. 7 is a view illustrating shapes of a metal layer and a metal pad according to a third embodiment of the present invention.

Referring to FIG. 7, a printed circuit board connector 100-2 according to the third embodiment of the present invention may include a substrate 110-2, holes 120a-2, grooves 120b-2, first metal pads 130a-2 and 130b-2, and second metal pads 140a-2 and 140b-2.

Here, the case in which the holes 120a-2 are formed in one row and the grooves 120b-2 are formed in one row is illustrated.

The first metal pad 130a-2 may be connected to one end of a metal layer 121a-2 in the hole 120a-2 formed in a first row of the substrate 110-2, and the second metal pad 140a-2 may be connected to the other end of the metal layer 121a-2.

The first metal pad 130b-2 may be connected to one end of a metal layer 121b-2 in the groove 120b-2 formed in a second row of the substrate 110-2, and the second metal pad 140b-2 may be connected to the other end of the metal layer 121b-2.

Figure 8A:
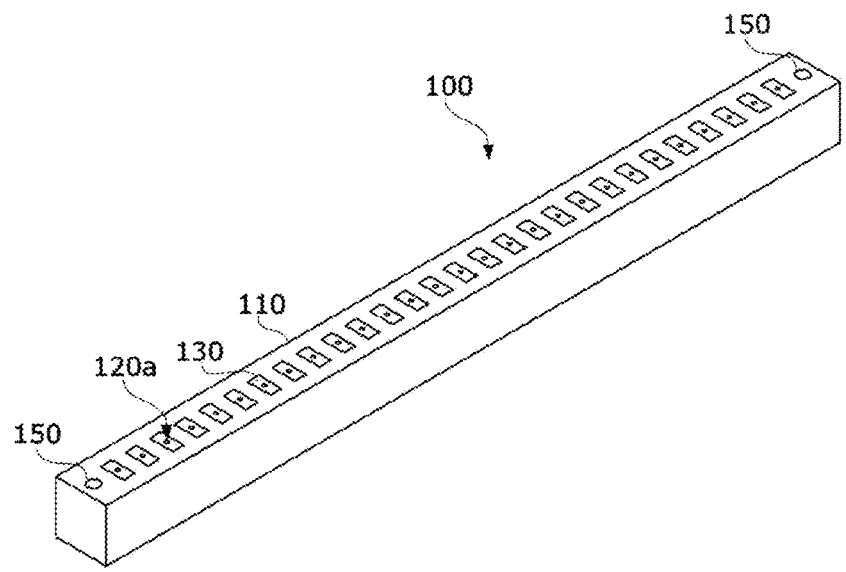
FIGS. 8A and 8B are views illustrating a printed circuit board connector according to a fourth embodiment of the present invention.
Figure 8B:
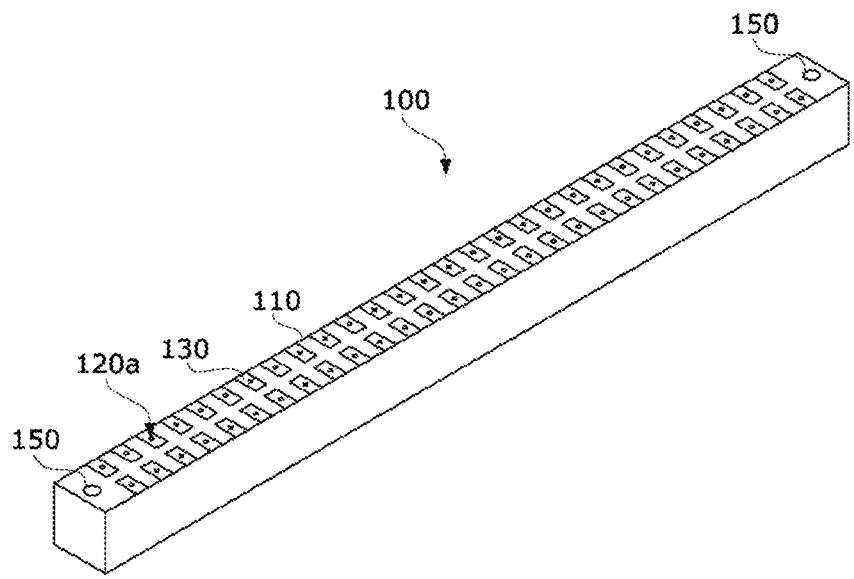

FIGS. 8A and 8B are views illustrating a printed circuit board connector according to a fourth embodiment of the present invention.

Referring to FIGS. 8A and 8B, the printed circuit board connector according to the fourth embodiment of the present invention may include a substrate 110-3, holes 120-3, first metal pads 130-3, second metal pads 140-3, and coupling grooves 150.

Here, the case in which the coupling grooves 150 are formed in both end portions of the substrate 110-3 is illustrated. The coupling grooves 150 may be formed in a first surface or a second surface of the substrate 110-3.

A spiral-shaped groove may be formed on an inner circumferential surface of the coupling groove 150. A groove of a coupling member may be coupled to the spiral-shaped groove formed on the inner circumferential surface of the coupling groove 150.

Figure 9B:
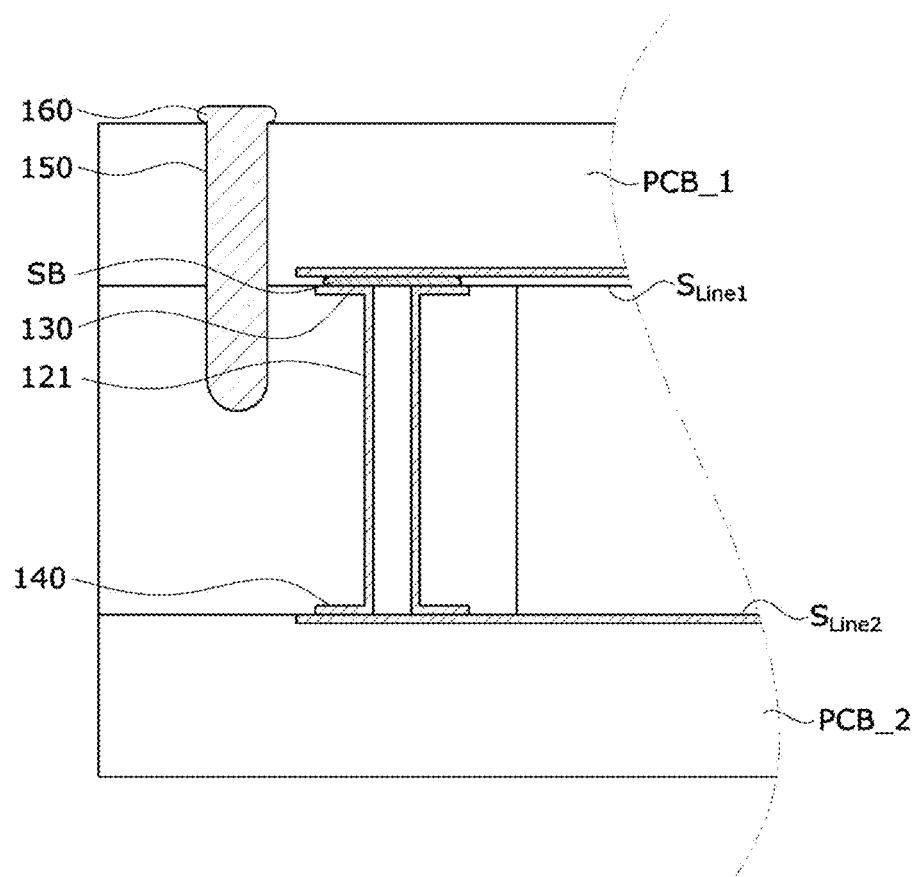

FIGS. 9A and 9B are views for describing another connection form of the printed circuit board connectors.

Referring to FIGS. 9A and 9B, in the printed circuit board connectors 100 according to the embodiment of the present invention, first metal pads 130-3 may be formed on a first surface of the substrate 110-3, second metal pads 140-3 may be formed on a second surface facing the first surface, and coupling grooves 150 may be formed at both end portions of the first surface of the substrate 110-3.

The first metal pad 130 may be bonded to a signal line $S_{Line1}$ of a first printed circuit board PCB_1, and the second metal pad 140 may be bonded to a signal line $S_{Line2}$ of a second printed circuit board PCB_2.

In this case, the first metal pad 130 and the second metal pad 140 cannot be bonded to both of the signal line $S_{Line1}$ of the first printed circuit board PCB_1 and the signal line $S_{Line2}$ of the second printed circuit board PCB_2 by soldering. For example, the second metal pad 140 may be bonded to the signal line $S_{Line2}$ of the second printed circuit board PCB_2 by soldering, and the first metal pad 130 may be brought into contact with the signal line $S_{Line1}$ of the first printed circuit board PCB_1 by using a solder ball SB.

In this case, the solder ball SB that enables the first metal pad 130 to be brought into contact with the signal line $S_{Line1}$ of the first printed circuit board PCB_1 has a different contact resistance according to a contact area. As the contact area increases, the constriction resistance decreases. Therefore, a metal having hardness with which a predetermined contact area may be secured may be used.

Constriction resistance $R_c$ may be expressed as in the following [Equation 1].

$$R_c = \frac{\rho\sqrt{H\pi}}{2\sqrt{F}} \quad \text{[Equation 1]}$$

Here, F denotes a contact force, p denotes resistivity, and H denotes hardness.

Through Equation 1 above, it can be seen that the constriction resistance is proportional to the hardness. Therefore, in the embodiment, a metal having hardness of 250 Mpa or less is intended to be used as a solder ball based on a metal having predetermined hardness, for example, Brinell hardness. The metal having the hardness of 250 Mpa or less may representatively include silver (Ag) having hardness in a range of 245 to 250 Mpa, gold (Au) having hardness in a range of 188 to 245 Mpa, tin (Sn) having hardness in a range of 51 to 75 Mpa, and lead (Pb) having hardness in a range of 38 to 50 Mpa.

In this case, the first metal pad 130 may be in incomplete contact with the signal line $S_{Line1}$ of the first printed circuit board PCB_1 by using a solder ball, and thus a coupling member may be used in order to compensate for the above incomplete contact.

To this end, the coupling groove 150 may be formed in the substrate 110-3, and a coupling member 160 passing through the first printed circuit board PCB_1 may be inserted into the coupling groove 150 to be coupled thereto.

Here, an example of the case in which the coupling member and the coupling groove have a spiral groove is described, but the present invention is not limited thereto, and the coupling member and the coupling groove may have one of various shapes in which the metal pad in contact with the signal line using the solder ball and the printed circuit board may be stably coupled.

Figure 10A:
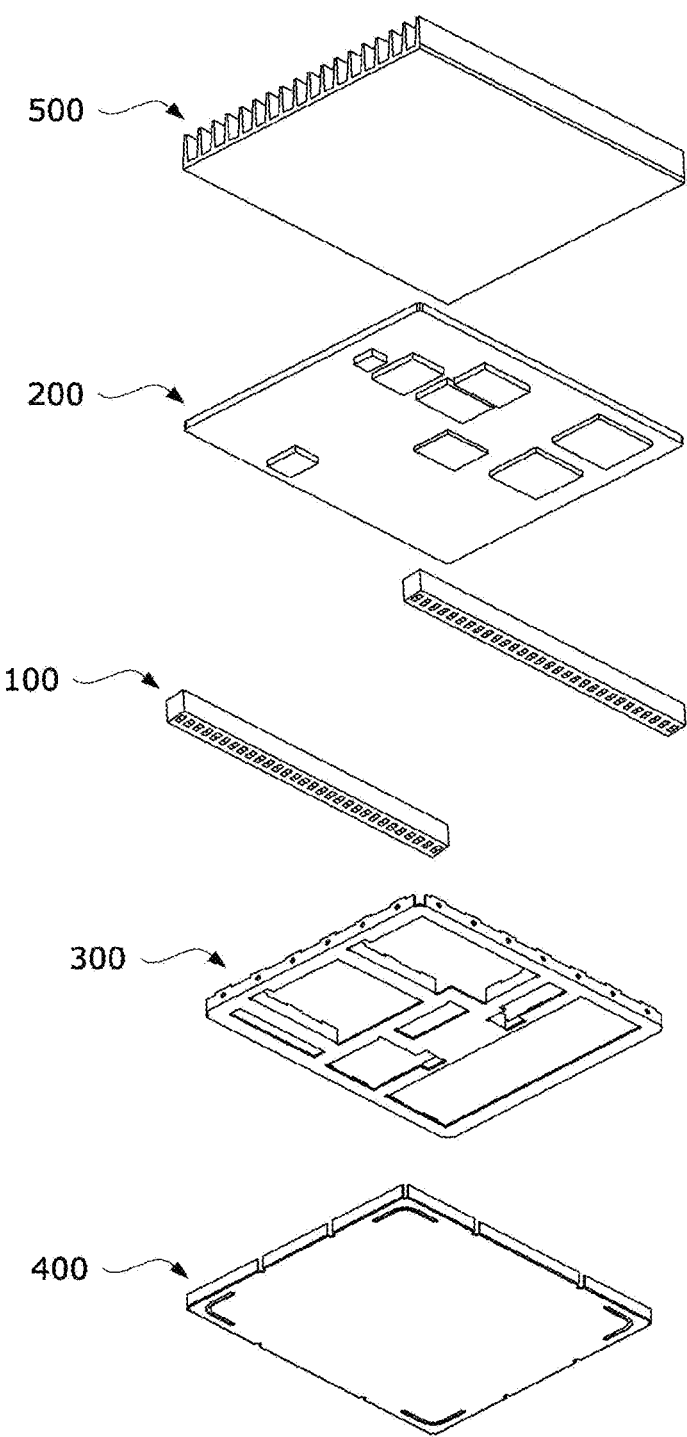
FIGS. 10A and 10B are exploded perspective views illustrating module devices according to embodiments of the present invention.
Figure 10B:
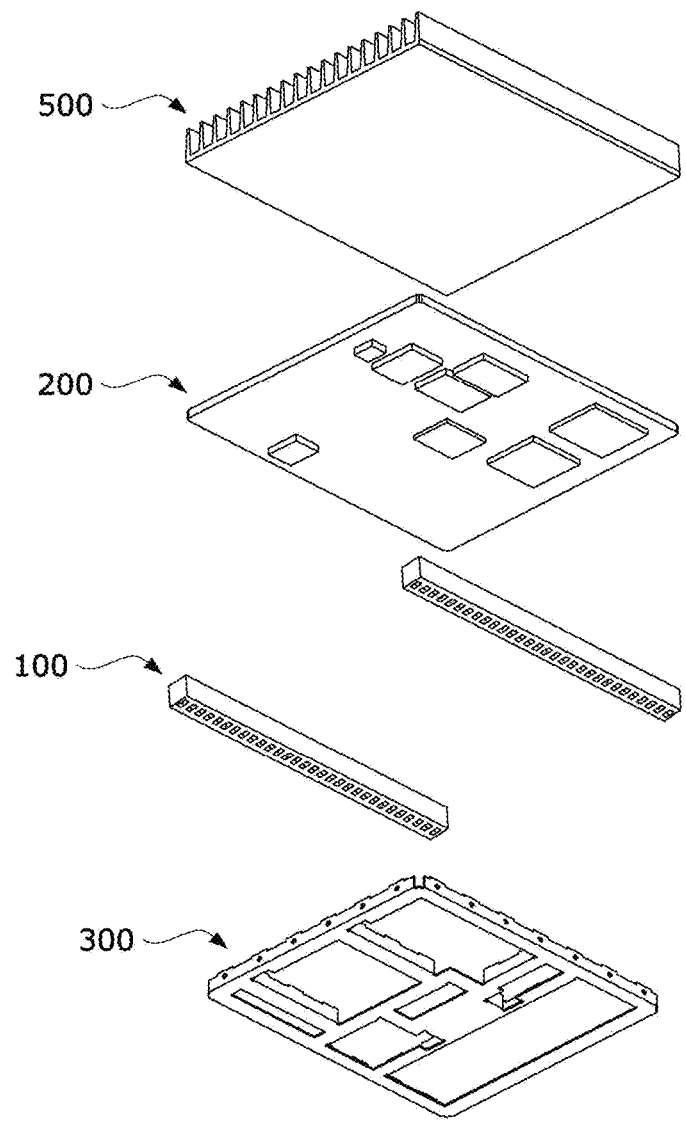

FIGS. 10A and 10B are exploded perspective views illustrating module devices according to embodiments of the present invention.

Referring to FIG. 10A, a module device according to an embodiment of the present invention may include printed circuit board connectors 100, a printed circuit board 200, a fence 300, a shield cover 400, and a heat dissipation plate 500.

The printed circuit board 200 may have one surface on which elements are mounted, wherein the one surface is disposed to face downward, and the printed circuit board connectors 100 for electrical connection with a main board may be coupled to both edges of one surface of the printed circuit board 200.

The fence 300 may be disposed under the printed circuit board 200, and the shield cover 400 may be disposed under the fence 300 for shielding.

The heat dissipation plate 400 may be disposed on the other surface of the printed circuit board 200, on which elements are not mounted.

Referring to FIG. 10B, a module device according to an embodiment of the present invention may include printed circuit board connectors 100, a printed circuit board 200, a fence 300, and a heat dissipation plate 500. In this module device, only the shield cover in FIG. 8A is not applied, and the other configurations and roles are the same as those in FIG. 10A.

Figure 11A:
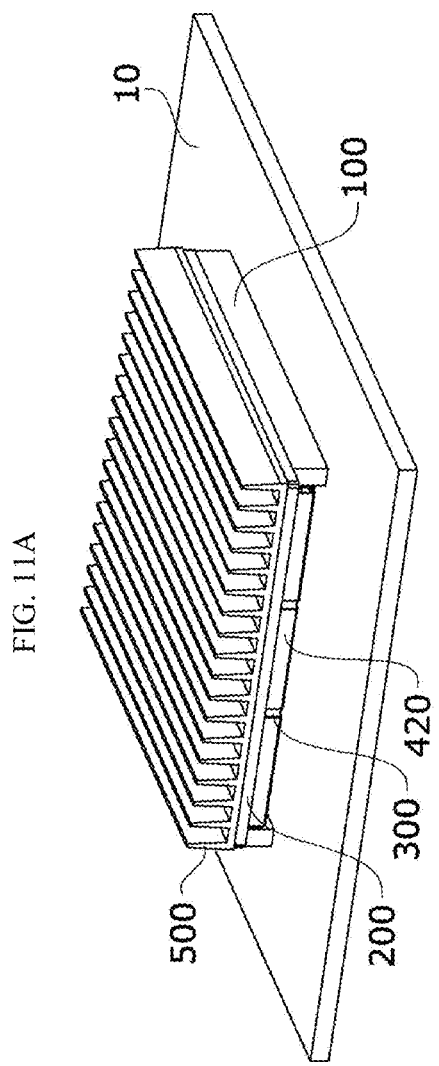
FIGS. 11A and 11B are views illustrating a module device according to an embodiment of the present invention.
Figure 11B:
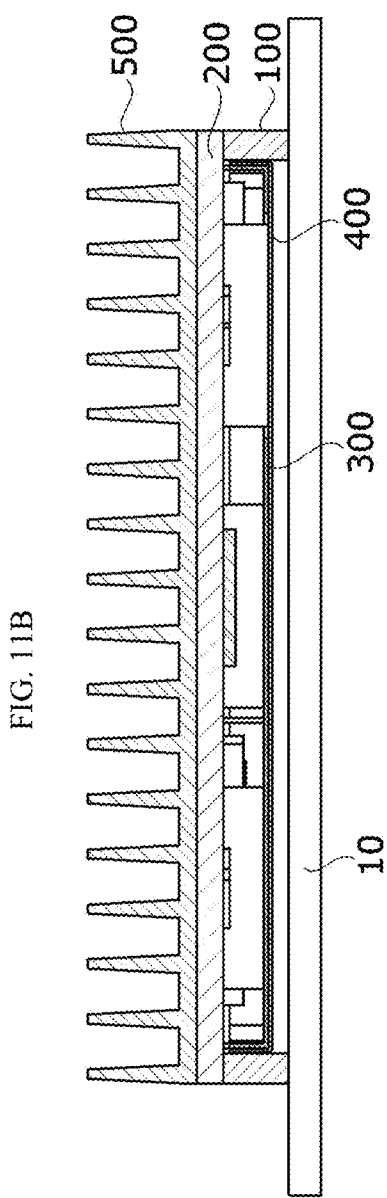

FIGS. 11A and 11B are views illustrating a module device according to an embodiment of the present invention.

Referring to FIGS. 11A and 11B, in the module device according to the embodiment of the present invention, a new interface structure, in which a first surface of a printed circuit board 200, on which elements are mounted, may be positioned to face downward, and printed circuit board connectors 100 are coupled to both edges of the printed circuit board 200 for connection with a main board 10, may be formed.

The printed circuit board connectors 100 may have a predetermined length, may be formed to be longer than a fence or a shield cover, and may have a length from the first surface longer than a height of the fence 300 or the shield cover 400.

Further, a heat dissipation plate 500 may be disposed on a second surface of the printed circuit board 200 so that the heat dissipation problem can be solved.

Therefore, in the embodiment, the conventional structure, in which the bottom surface of the printed circuit board in the module device is generally connected to the main board by soldering, is not used, whereas a heat dissipation structure, in which a printed circuit board is rotated 180 degrees so that a bottom surface of the printed circuit board faces upward, and a heat dissipation plate is disposed on the bottom surface, and an interface structure, in which connectors are coupled to both edges of the printed circuit board so that the heat dissipation plate is connected to the main board using the connectors, may be provided. Here, the module device may include a communication modem or the like mounted on a vehicle.

While exemplary embodiments of the present invention and their advantages have been described above in detail, it should be understood by those skilled in the art that various changes, substitutions, and alterations may be made herein without departing from the scope of the present invention as defined by the following claims.

REFERENCE NUMERALS

110: SUBSTRATE
120a: HOLE
120b: GROOVE
121: METAL LAYER
130: FIRST METAL PAD
140: SECOND METAL PAD

The invention claimed is:

1. A printed circuit board connector comprising:
a substrate;
a plurality of holes formed in the substrate at predetermined intervals and having an inner circumferential surface coated with a metal material to form a metal layer;
a first metal pad formed at one end of each hole of the plurality of holes and connected to the metal layer; and
a second metal pad formed at an other end of each hole of the plurality of holes and connected to the metal layer,
wherein the substrate is formed to have a bar shape, and
wherein the holes are arranged at a predetermined interval in a longitudinal direction of the bar shape of the substrate.

2. The printed circuit board connector of claim 1, wherein:
the substrate includes a first surface and a second surface facing the first surface;
the first metal pad is formed on the first surface and the second metal pad is formed on the second surface; and
the first metal pad and the second metal pad have a one-to-one correspondence.

3. The printed circuit board connector of claim 2, wherein the first metal pad is bonded to a signal line of a first printed circuit board disposed on the first surface of the substrate by welding, or is brought into contact with the signal line of the first printed circuit board by using a solder ball.

4. The printed circuit board connector of claim 2, wherein the second metal pad is bonded to a signal line of a second printed circuit board disposed on the second surface of the substrate by soldering.

5. The printed circuit board connector of claim 1, comprising coupling grooves formed at end portions of a first surface of the substrate to be coupled to coupling members.

6. A printed circuit board connector comprising:
a substrate;
a plurality of grooves formed in the substrate at predetermined intervals and having an inner circumferential surface coated with a metal material to form a metal layer;
a first metal pad formed at one end of each groove of the plurality of grooves and connected to the metal layer; and
a second metal pad formed at an other end of each groove of the plurality of grooves and connected to the metal layer,
wherein the substrate is formed to have a bar shape, and
wherein the grooves are arranged at a predetermined interval in a longitudinal direction of the bar shape of the substrate.

7. The printed circuit board connector of claim 6, wherein:
the substrate includes a first surface and a second surface facing the first surface;
the first metal pad is formed on the first surface and the second metal pad is formed on the second surface; and
the first metal pad and the second metal pad have a one-to-one correspondence.

8. The printed circuit board connector of claim 7, wherein the first metal pad is bonded to a signal line of a first printed circuit board disposed on the first surface of the substrate by welding, or is brought into contact with the signal line of the first printed circuit board by using a solder ball.

9. The printed circuit board connector of claim 7, wherein the second metal pad is bonded to a signal line of a second printed circuit board disposed on the second surface of the substrate by soldering.

10. The printed circuit board connector of claim 6, comprising coupling grooves formed at both end portions of a first surface of the substrate to be coupled to coupling members.

11. A module device comprising:
- a printed circuit board including a first surface on which elements are mounted and a second surface facing the first surface;
- the printed circuit board connector according to claim 1, which is coupled to edge portions of the printed circuit board through the first and second metal pads of the printed circuit board connector;
- a heat dissipation plate disposed on the second surface; and
- a fence disposed on the first surface and positioned between the printed circuit board connectors.

* * * * *